United States Patent [19]
Drottar et al.

[11] Patent Number: 6,147,366
[45] Date of Patent: Nov. 14, 2000

[54] ON CHIP CMOS OPTICAL ELEMENT

[75] Inventors: Ken Drottar; David Dunning, both of Portland, Oreg.

[73] Assignee: Intel Corporation, Santa Clara, Calif.

[21] Appl. No.: 09/248,350

[22] Filed: Feb. 8, 1999

[51] Int. Cl.[7] .................................................. H01L 27/15
[52] U.S. Cl. ................................. 257/82; 257/80; 257/84
[58] Field of Search ................................. 385/14; 257/82, 257/84, 431, 215, 80

[56] References Cited

U.S. PATENT DOCUMENTS

| | | | |
|---|---|---|---|
| 4,479,139 | 10/1984 | Parrish | 357/24 |
| 4,642,877 | 2/1987 | Garner et al. | 29/571 |
| 5,987,196 | 11/1999 | Noble | 385/14 |

*Primary Examiner*—Charles Bowers
*Assistant Examiner*—Scott J. Hawranek
*Attorney, Agent, or Firm*—Fish & Richardson P.C.

[57] ABSTRACT

CMOS optical receiver and optical transmitters are described. The optical receiver is formed from a CMOS CCD which is modified to immediately output all information indicative of incoming light, i.e., with no transfer gate. The optical transmitter is formed of a modulation window device. Both the optical transmitter and optical receiver are located on-chip with a microprocessor and form the I/O for the microprocessor. Since the modified I/O is serial, a serial to parallel converter, and parallel to serial converter are provided.

7 Claims, 2 Drawing Sheets

ON CHIP CMOS OPTICAL ELEMENT

BACKGROUND

Optical technology allows high speed wireless communication. Optical signals can be carried at very high bandwith and low noise. Such signals can also travel for much longer distances, e.g. on the order of kilometers. Many optical receivers are used to receive signals that have been sent over tens of kilometers. Since the signal is received in optical form, there are also fewer problems with ground loops, cross talk and noise.

Photoreceptors for optical signals are often formed in non-standard substrates such as InP or GaAs to obtain the high sensitivity that is necessary for receiving optical signals that have traveled over the long distances. These substrates are often incompatible with the CMOS substrates used for many other IC processes, e.g. microprocessors.

Optical transmitters similarly have been formed in non-standard substrate types and materials. In addition, optical transmitters often require substantial power to be generated on the optical chip, e.g. to generate the light for transmission.

Some optical transmitter configurations form a semiconductor laser on the chip. However, these systems are also relatively difficult to reliably manufacture.

The high bandwidth capability of optical signals allows the medium to carry much information.

Modern processors require high data input and output. Typical connections to a processor are made in parallel to provide the required throughput. This requires large numbers of connection pins. For example, a 128-bit processor may use 128 input lines for the data input. As processors become more powerful, it becomes increasingly difficult to provide enough pins to allow the desired connections.

The high bandwidth of optical technology could allow serial communication at much higher speed over fewer lines. This could reduce the pin count. However, the non-standard semiconductor technology has made this an unattractive option.

Modern chip fabrication is often done in CMOS. If a different kind of fabrication technology is used for the optical sensor or transmitter, that optical sensor or transmitter is preferably formed on a totally separate substrate from the CMOS sensor.

The power consumption of the optical transmitters makes it even more unattractive, since processors already have extreme power consumption and cooling requirements. Adding additional power consumption is undesirable.

SUMMARY OF THE INVENTION

The present system describes CMOS compatible optical devices on chip with CMOS circuits, preferably CMOS microprocessors.

The circuit is formed with an silicon substrate with a CMOS circuit using a charge coupled device formed in the substrate, using a logic family that is compatible with CMOS. The optical receiver has an input connected to receive a serial stream of optical information. The output of the optical receiver is connected to the circuit. This optical receiver hence forms the input for the circuit.

In an alternate system, an optical transmitter is formed in the substrate, from a logic family that is compatible with CMOS.

The optical transmitter has an input that is connected to receive output from the microprocessor. It has an output that modulates a light source, from an external source, according to the output from the microprocessor. This optical receiver hence forms the output for the microprocessor.

BRIEF DESCRIPTION OF THE DRAWINGS

These and other aspects will now be described with respect to the accompanying drawings, in which.

DESCRIPTION OF THE PREFERRED EMBODIMENTS

The present disclosure describes techniques of using CMOS and CMOS-compatible fabrication techniques to form an optical device, e.g., an optical transmitter and/or an optical receiver, on a substrate along with associated CMOS circuitry, e.g., a processor, which can be a microprocessor such as a digital signal processor or DSP. The processor receives and transmits information using the on-chip optical devices. For example, the optical receiver is formed on the same substrate with the microprocessor. The incoming data to the processor, e.g., from the hard disk, BIOS and I/O is input to the microprocessor via the on chip optical receiver.

The optical transmitter is also preferably formed on the same substrate with the processor to carry the processor output.

In a preferred mode, all microprocessor I/O is via single channel serial communication, using a single, high speed line for each of input and output.

Figure 1:
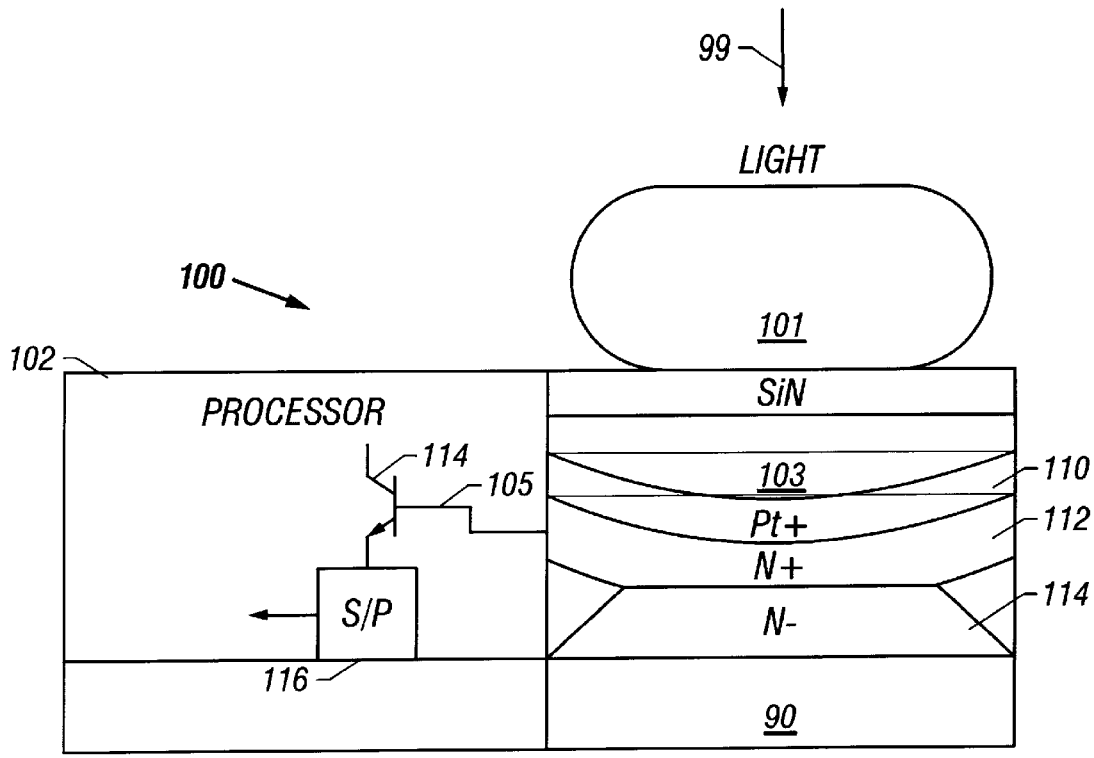
FIG. 1 shows a diagram of a CMOS microprocessor with an on-chip optical receiver formed from a special CCD device.

A first embodiment is shown in FIG. 1. A single silicon substrate 100 is shown with a processor portion 102 that is formed with CMOS circuitry. A light sensor portion 103 is formed using a formation process compatible with CMOS, e.g., CMOS, NMOS, PMOS, or general MOS, or any feature compatible with any of PMOS, NMOS, or CMOS. The electrical output of the CMOS light sensor is coupled to the processor 102. In operation, the CMOS light sensor produces a signal indicative of incoming light. The signal indicative of incoming light is an electrical signal which is coupled to the processor 102. Processor 102 accepts its input via the optical signal, and takes some action based on the electrical signal applied thereto.

The present system is preferably used in communication in personal computing. Such communication typically sends light for much shorter distances than the distances which are typical for communication. Communication devices, for example, may require the light to travel tens of kilometers. In personal computing, a few inches to 100 meters is a more typical value. Since the light travels smaller distances, less-sensitive optical receivers can be used.

According to the present system, a charge-coupled device or "CCD" is used. The CCD is inherently light sensitive. Charge coupled devices have typically been used as a register for charge. The charge is acquired by a photosensitive device which converts incoming light photons to charge. Typical such photosensitive devices include a photodiode or a photogate. The charge is stored by the CCD.

A typical use of a CCD is shown in U.S. Pat. No. 4,479,139. An incoming photon is converted to charge by a photodiode and stored in the CCD. CCD's are often made using CMOS processes, as described for example in U.S. Pat. No. 4,642,877.

A special CCD is used as a short haul communications photoreceptor. The CCD is placed on the substrate with CMOS circuitry, e.g. a processor, that carries out some action based on the content of the incoming light signal. This configuration has a number of advantages. CCD technology is already well-developed for applications such as video capture. CCDs are also inherently low noise devices. In addition, CCDs inherently operate serially which is the preferred mode for this operation.

In the preferred mode, the optical device is aligned to the underlying board 90 using a ball grid array technique. These techniques are well known in the art. A number of balls with solder are provided. When heated, the solder melts, and its surface tension forces the component into proper registration.

Hence, ball grid array technology can be used to align the optical interfaces between chip and board. The detailed structure of the CCD light receiver is shown in FIG. 1. Incoming light 99 is received either as laser light, or some other collimated light, or from a fiber. The incoming light 99 is coupled to a microlens 101 formed on the top surface of silicon substrate 100. The incoming light is coupled to the light sensor portion 103 which is shown including a silicon nitride layer and a silica layer. The CMOS CCD is photosensitive, and hence produces an output signal on the line 105 that is proportional to the amount of light 99 that is received. The output current 105 is first buffered by a source follower 114, and output to the processor 102 within the silicon substrate 104.

A conventional CCD might include a buried charge storage area. Typically a thin P++ type region 110 and a N+ region 112 below the P++ region form the charge storage area along with perhaps additional doped regions, e.g., N– region 114. The charge is conventionally not allowed to leave the storage area freely, i.e., it is integrated in the charge storage area. A readout gate is located between the charge storage area and a charge transfer area, also called a shift register portion. The shift register portion is typically shielded by metal to prevent that area from accumulating charge from stray incoming light.

This embodiment is a special CCD that is different from the standard CCD which integrates the charge for an integration time. This system, in contrast, outputs instantaneous readout of the incoming light. The light causes P++ layer 110 and N+ layer 112 to produce charge. A current indicative of the charge is output from the N+ layer to the electrical line 105, as produced. A source follower 114 in the CMOS circuitry receives the instantaneous value. When the charge is sufficient to forward bias the gate junction of the source follower 114, the transistor turns on, to signify a change in state. Conversely, when the light is not present, the charge dissipates, and the source follower 114 turns off. All this is instantaneously applied to the source follower 114 without a separate transfer gate.

Of course, the opposite sense to that described herein is also possible, e.g. by using a PMOS source follower.

The high speed serial information as received by the source follower is converted to parallel by an on-chip serial to parallel converter, and used to provide data to the parallel input connections of the microprocessor.

Additional substrate layers, including N– layer 114 and additional P and N layers may be provided to enhance the charge production. Any of the well-known standard techniques for CCD can be used with the above teaching, to form a CCD which immediately outputs the light-indicative signal without integrating.

A second embodiment refers to a optical transmitter formed in a silicon substrate along with CMOS circuitry that is associated with the optical transmitter. This embodiment uses an optical switch as a short-haul communication phototransmitter. The optical switch is formed of silicon using a process compatible with CMOS. For example, this can use an optically movable mirror. The silicon window forms a modulation window 200 in an optical waveguide 202. The modulation window can be selectively turned on and off under control of an electrical signal in the bond wire 204 connecting the silicon CMOS chip 210 to the optical portion 199.

The modulation window can be formed in a number of different ways, including, but not limited to, a movable mirror of the type described in U.S. Pat. No. 4,938,555. Light from an external light source 220 is used. The output light 222 is coupled into the waveguide 199 and driven to the modulation window 220. The light is selectively allowed to pass under control of the electrical signal on the wire 204 which is correspondingly driven from a CMOS element 207 in silicon chip 210. In the case of a digital optical transmitter, the light is allowed to pass when the CMOS switch 207 is on, and light is prevented from passing when the CMOS switch 207 is off. The power and amount of light is dependent on the external light source 220 which is separate from the substrate 209 on which the processor 210 and optical portion is formed. Moreover, since the light source is off the chip, its power consumption is external to the chip. This avoids the necessity to consume power on the chip. This allows the processor to run cooler and hence be more linear. Therefore, rather than generating light, this phototransmitter modulates light through the waveguide.

The microprocessor produces parallel output information, which is converted to serial by an on-chip parallel to serial converter 206. The output of the P/S converter drives the CMOS switch.

Figure 2:
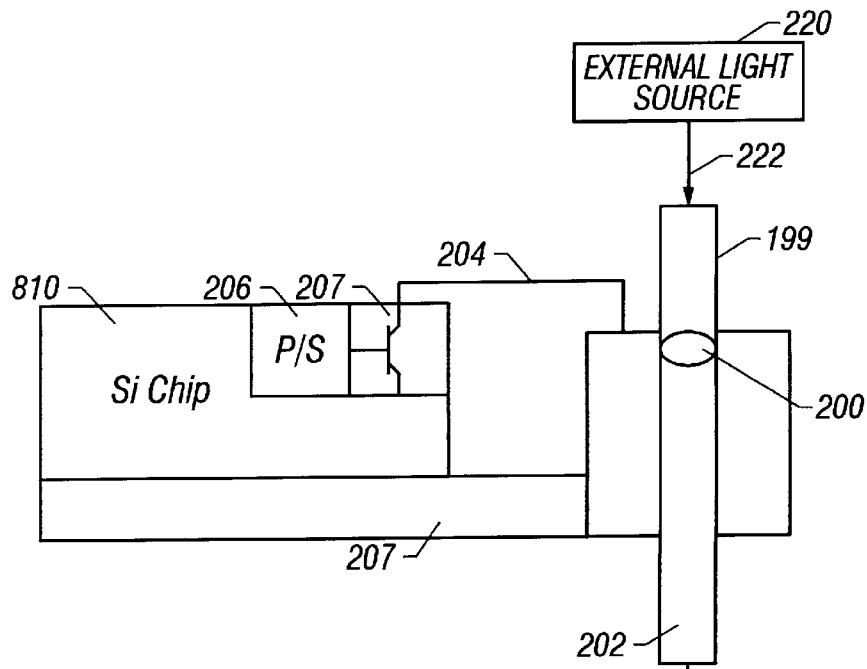
FIG. 2 shows a diagram of a CMOS processor on chip with an optical transmitter.
Figure 3:
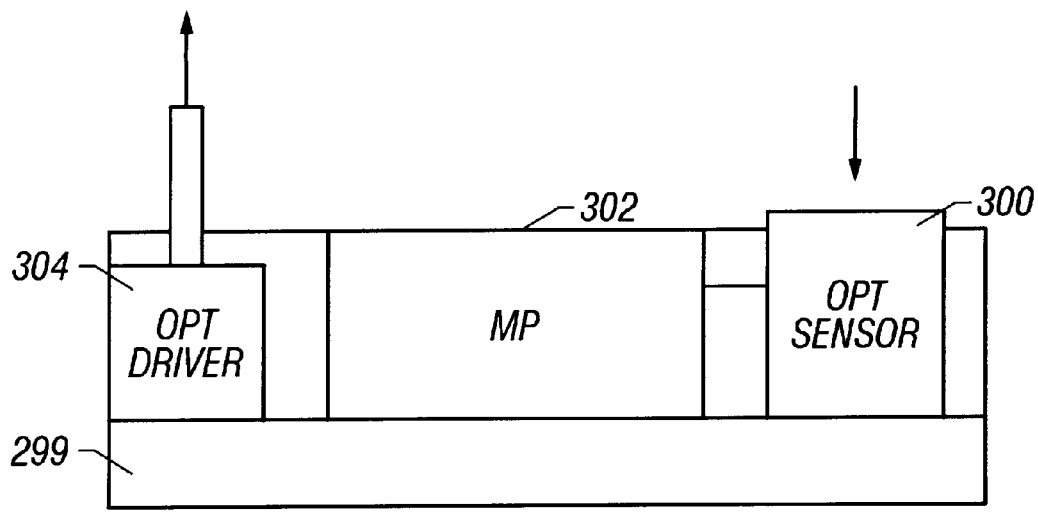
FIG. 3 shows a CMOS processor with both optical transmitter and optical receiver, both on chip.

A specific preferred embodiment is shown in FIG. 3. The chip of FIG. 3 includes a CMOS light sensor 300 of the type described in FIG. 1 to receive input to processor 302. A CMOS light valve 304 of the type shown in FIG. 2 is also on the same substrate 299 to output the information from the processor.

Figure 4:
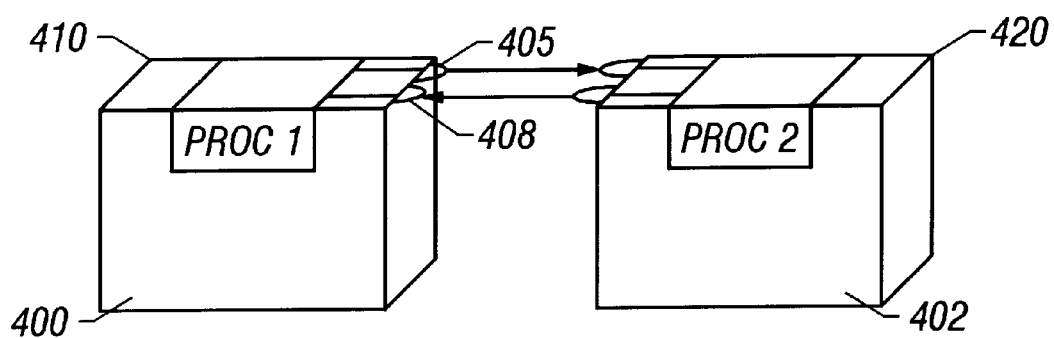
FIG. 4 shows a multiple processor system.

FIG. 4 shows a specific preferred embodiment using two processors 400, 402 on separate substrates 410, 420. The two processors each have an associated optical transmitter and receiver of the type described above. The first substrate has a transmitter 405 and receiver 408. The two devices hence communicate optically.

Although only a few embodiments have been described in detail above, those of skill in the art recognize that many modifications are intended and predictable from the disclosed embodiments. For example, other CMOS compatible optical devices can be used, including an active pixel sensor, or a digital mirror. Other circuits besides the microprocessor can be driven.

All such modifications are intended to be encompassed within the following claims.

What is claimed is:

1. A microprocessor circuit, comprising:
   an optical substrate;
   a microprocessor, formed in said substrate;
   an optical receiver, formed of a logic family that is compatible with CMOS, also formed in said substrate, having an input connected to receive a serial stream of optical information, and having an output connected to said microprocessor; and an optical transmitter, formed of a logic family that is compatible with CMOS, also formed in said substrate, and having an input connected to receive output from said microprocessor, and having an output that modulates a light source according to said output from said microprocessor.

2. A circuit as in claim 1, further comprising a serial to parallel converter, connected to receive an output of said optical receiver, and convert said output to parallel information, and connecting said parallel information to said microprocessor, and further comprising a parallel to serial converter, receiving parallel information from said microprocessor, converting said information to serial, and coupling the serial information to said optical transmitter.

3. A circuit as in claim 2, wherein said optical transmitter is an optical modulator that passes light to represent a first logic state, and blocks light to represent a second logic state.

4. A circuit as in claim 2, wherein said optical receiver is a charge coupled device, configured in a way to produce an instantaneous readout of an amount of incoming light incoming thereto without integrating said light, and producing an electrical signal indicative thereof.

5. A circuit as in claim 4, wherein said optical transmitter is an optical modulator that passes light to represent a first logic state, and blocks light to represent a second logic state.

6. A circuit as in claim 5, wherein said charge coupled device produces instantaneous charge indicative of incoming light, and does not have a transfer gate.

7. A CMOS circuit, comprising:

a silicon substrate having a CMOS-fabricated circuit therein; and an optical modulating device, formed on said silicon substrate using a formation process that is compatible with CMOS, and configured in a way to produce a light blocking action when an output of said CMOS-fabricated circuit is a first logic state, and to produce a light passing action when said output of said CMOS-fabricated circuit is a second logic state, said optical modulating device having a first end that receives light from an external light source;

wherein said microprocessor operates to produce output information in parallel form, and further comprising a parallel to serial converter, converting parallel information from said microprocessor to serial for said optical modulator.

* * * * *